United States Patent [19]

Havens

[11] Patent Number: 4,573,028
[45] Date of Patent: Feb. 25, 1986

[54] MECHANICAL FILTER APPARATUS HAVING INTERCHANGED RESONATOR MEANS FOR IMPROVED COUPLING OF BRIDGING WIRES

[75] Inventor: Donald P. Havens, Costa Mesa, Calif.

[73] Assignee: Rockwell International Corporation, El Segundo, Calif.

[21] Appl. No.: 549,046

[22] Filed: Nov. 7, 1983

[51] Int. Cl.⁴ .............................................. H03H 9/50
[52] U.S. Cl. .................................... 333/198; 333/186; 333/197
[58] Field of Search ....................... 333/186, 197–199

[56] References Cited

U.S. PATENT DOCUMENTS

| | | | |
|---|---|---|---|
| 2,662,216 | 12/1953 | Klinkhamer | 333/168 |
| 3,577,180 | 5/1971 | Albsmeier | 333/198 |
| 3,794,938 | 2/1974 | Boelter | 333/168 |
| 3,986,151 | 10/1976 | Kanazawa et al. | 333/197 |
| 4,197,516 | 4/1980 | Ernyei et al. | 333/198 |
| 4,241,321 | 12/1980 | Kasai et al. | 333/198 |

OTHER PUBLICATIONS

Weinberg–"Network Analysis and Synthesis", McGraw–Hill, New York, 1962, pp. 80–86.

Primary Examiner—Marvin L. Nussbaum
Attorney, Agent, or Firm—Bruce C. Lutz; V. L. Sewell; H. Fredrick Hamann

[57] ABSTRACT

By exchanging the position of the input and output resonator means relative to other resonator elements in a mechanical filter, the lengths of the bridging wires used to control the steepness of the bandpass characteristic of the filter can be reduced. Reducing the length of the bridging wires reduces both flexural spurious mode problems and extensional coupling variation problems.

6 Claims, 7 Drawing Figures

MECHANICAL FILTER APPARATUS HAVING INTERCHANGED RESONATOR MEANS FOR IMPROVED COUPLING OF BRIDGING WIRES

THE INVENTION

The present invention is generally directed to filters and more specifically directed to mechanical filters. Even more specifically, the present invention is involved with rearranging the order of input and output transducer elements used as resonators in a mechanical filter with respect to the acoustically coupled resonating elements used in the mechanical filter.

BACKGROUND

Bridging wires have been used between resonator elements in mechanical filters for creating finite attenuation poles. In order to create poles on both sides of the upper and lower skirts of a filter, two or more resonators must be bridged with a coupling means such as a wire. If the length of the wire is close to a resonant length, the coupling will be sensitive to small variations in the length between attachment paints and spurious modes may be present in the filter response.

There is a considerable amount of prior art on the subject and a typical example of a prior art patent is Kasai, et al. U.S. Pat. No. 4,241,321, assigned to Fujitsu Limited, in Japan.

It is the extensional and flexural mode resonances which usually cause problems with coupling in bridging wires in a mechanical filter. Depending on what type of coupling is used, the effect of these two resonant modes are different. As will be explained in more detail later, at wire lengths commencing with zero and at various other lengths equal to half integer multiples of the resonant wavelength, the coupling increases to infinity. With relatively short wire lengths, where the order of the flexural spurious modes are low, the effect of the coupling of the modes is significant only when the wire length is within a few thousands of an inch of the resonant length. For higher order spurious modes, where the wire is longer, the effects of the flexural spurious modes are spread over a wider span of length. Because of this, it is advantageous to keep the wire short.

A solution to the problem as set forth in this invention, is to change the order of the resonators whereby, for several embodiments of the inventive concept, the bridging wire is required to cross only over one resonator. Prior art similar mechanical filters had to pass the bridging wire over at least two resonators. While the new design requires that the coupling wires for coupling signal from input to output to produce the bandpass filter must have some of the coupling elements increased in length, the overall design is still more tolerant of errors in attachment of the coupling wires used in the filter.

It is therefore an object of the present invention to improve the ease of manufacture of a mechanical filter.

Other objects and advantages of the present invention may be ascertained from a reading of the specification and appended claims in conjunction with the drawings wherein:

FIG. 1 is a graph of the extensional coupling of a given mechanical filter as a function of wire length;

FIGS. 2a and 2c are prior art mechanical filters and FIGS. 2b and 2d are new designs based on the respective prior art implementations of 2a and 2c;

FIG. 3 is a more detailed drawing of one embodiment of the inventive concept as presently practiced; and FIG. 4 is a representation of the bandpass characteristic of a mechanical filter of the type represented by FIG. 3.

DETAILED DESCRIPTION

Figure 1:
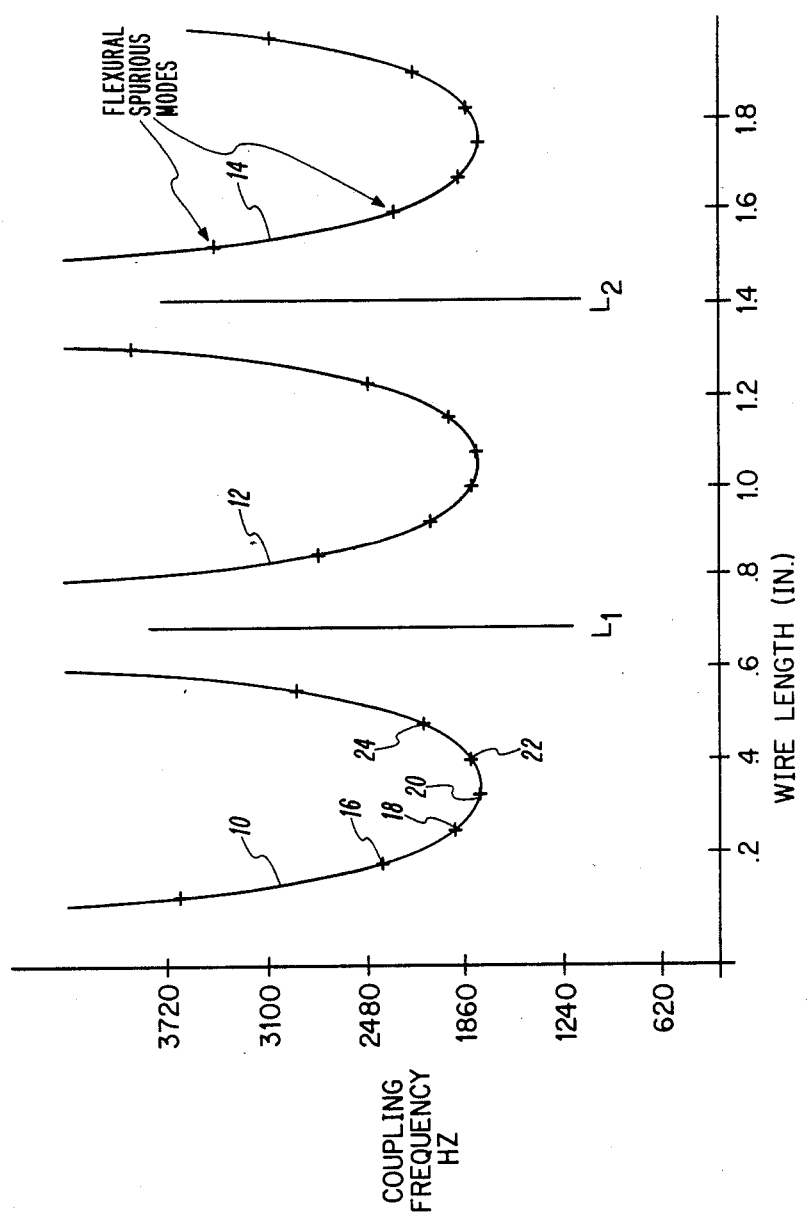

In FIG. 1 a graph is presented with the vertical scale being a representation of extensional coupling as a function of frequency for a bandpass filter and the horizontal scale as a function of length of the coupling wire. In the graph of FIG. 1 plots 10, 12 and 14 are shown each starting with infinite coupling going to a minimum and returning to infinite coupling. Between plots 10 and 12 is a line labeled $L_1$ where the length of the wire equals a half integer value of the extensional resonant wavelength. At this point, the coupling increases to infinity. Between graph representations of plots 12 and 14, another resonant point is labeled $L_2$. The wire length at this value is a full wavelength extensional resonant length. On the line representations 10 through 14 are a plurality of pluses labeled 16, 18, 20, 22 and 24. Further pluses are shown on the remaining graph lines 12 and 14. These pluses show the length of the wire at which the flexural resonant modes occur. Both extensional and flexural mode resonances are explained in more detail in many sources and one source is a book entitled, "Mechanical Filters In Electronics", by Robert A. Johnson, published by John Wiley & sons and copyrighted in 1983.

The above graph represents values for a specific filter and the wire lengths and frequencies would differ for other filters. The information in the graph is to be taken as representative of a specific design for explanation purposes only.

Figure 2A:
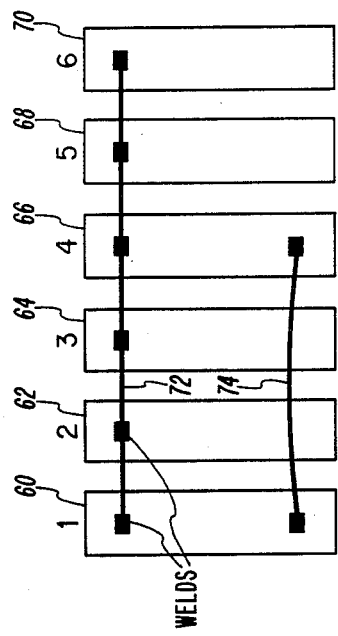

In FIG. 2a an input resonator 30 and an output resonator 32 are shown at the extremities of a row of resonator elements labeled 34, 36, 38 and 40. A series of coupling wires generally designated as 42 connect each of the resonators at the ends with the intermediate resonator elements. A bridging wire 44 connects element 34 with element 40 for the purpose of adjusting the steepness of the bandpass characteristic. This bridging wire bridges coupling wire elements between resonator elements 34 and 40 to accomplish this purpose.

Figure 2C:
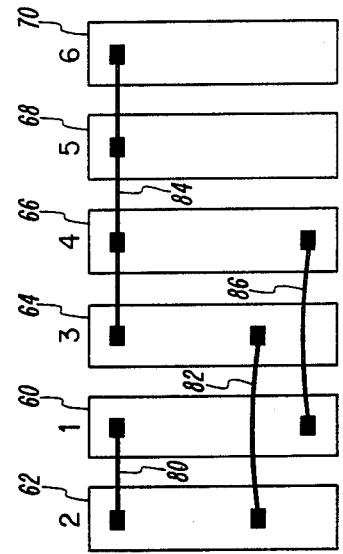
Figure 2B:
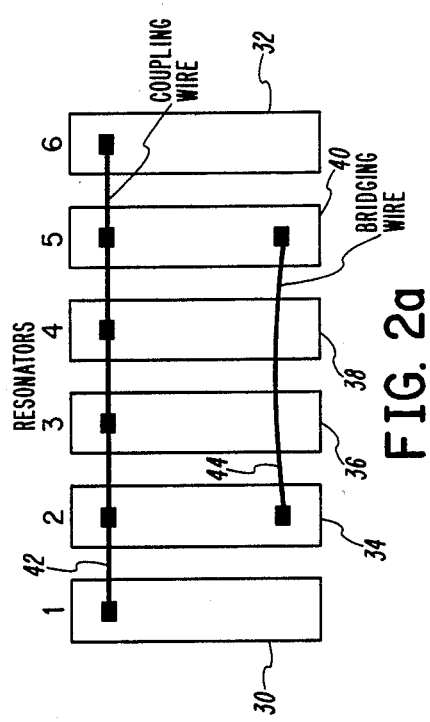

FIG. 2b uses the same designators on each of the resonator elements as used in FIG. 2a. It will be observed, however, that the coupling wires designated as 46, 48, 50 and 52 are in some cases longer than the corresponding coupling wires in FIG. 2a. However, a bridging wire 54 in FIG. 2b is shorter than the corresponding bridging wire 44 in FIG. 2a.

In FIG. 2c a prior art approach to a filter section is shown with an input resonator element designated as 60 and further resonator elements 62, 64, 66, 68 and 70. Each of these elements is connected in acoustical series via a set of coupling leads or wires 72. A bridging wire 74 connects input element 60 to resonator element 66.

Figure 2D:
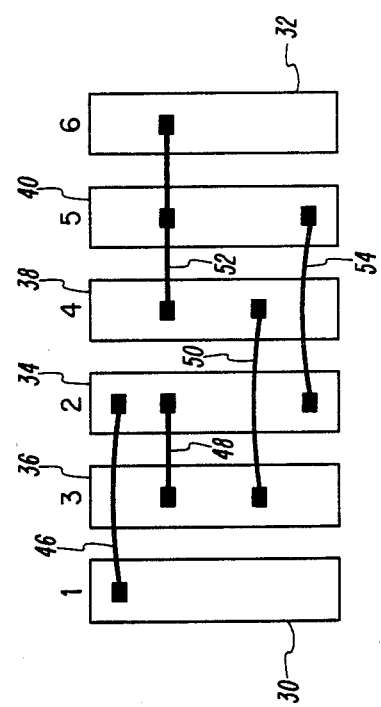

FIG. 2d shows a mechanical filter section accomplishing the same end result as is accomplished in FIG. 2c and the corresponding resonator elements are labeled in identical fashion. However, it will be noted that there are coupling wires 80, 82 and 84 used to accomplish the same series acoustic coupling function as accomplished by the set of wires 72 in FIG. 2c. In addition, a bridging wire 86 is shown coupling input resonator element 60 to resonator element 66. While coupling wire 82 is longer than the corresponding wire in FIG. 2c, the reduction of the length of bridging wire 86 is such that the overall design and accompanying reduction in manufacturing problems more than compensates for the increased length of coupling wire 82.

Figure 3:
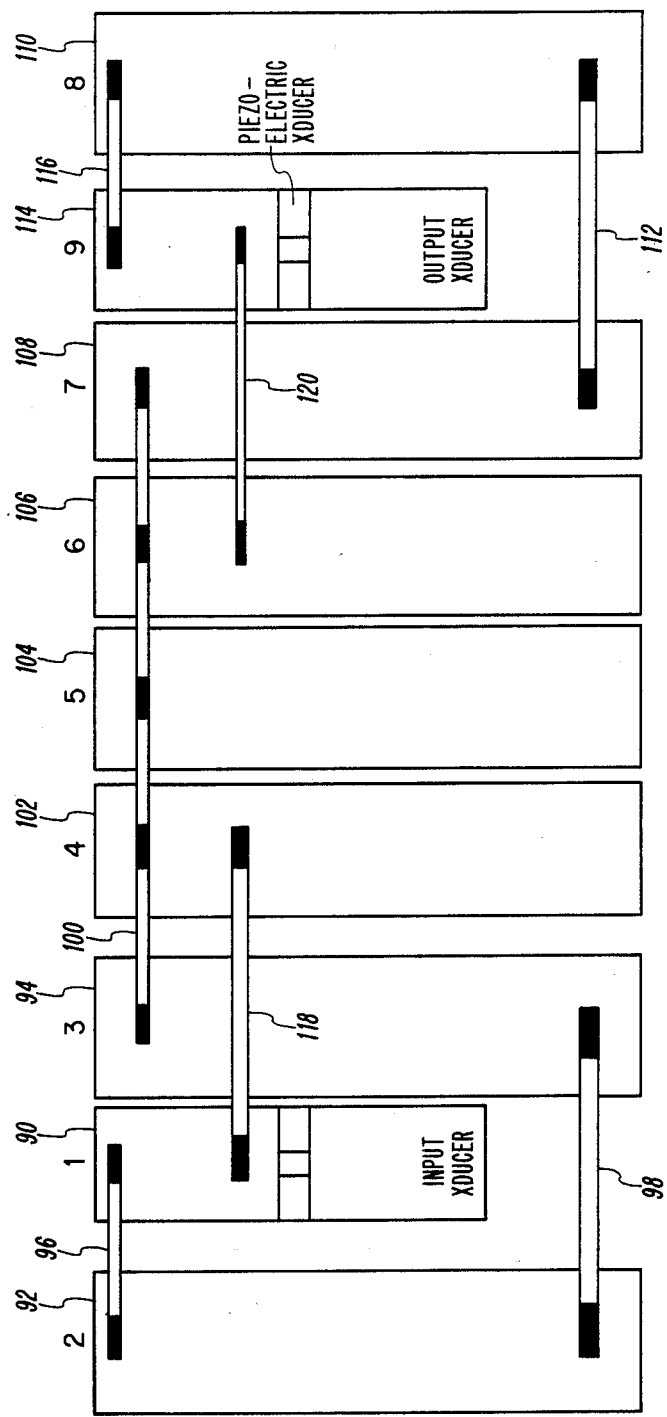

In FIG. 3 an input transducer resonator element 90 which operates in the flexural mode is shown intermediate resonator elements 92 and 94. A first coupling wire 96 connects input transducer resonator 90 with resonator element 92. A further coupling wire 98 connects resonator element 92 with resonator element 94. A set of coupling wires 100 connect resonator element 94 consecutively to resonator elements 102, 104, 106 and 108. Resonator element 108 is then connected to a resonator element 110 via a coupling wire 112 and resonator element 110 is connected to an output transducer resonator element 114 via a coupling wire 116. Each of the resonator elements 92 through 110 operate in the torsional mode while the input and output transducer resonators 90 and 114 operate in the flexural mode. A bridging wire 118 connects input transducer resonator 90 to resonator element 102 while a bridging wire 120 connects output transducer resonator 114 to resonator element 106. The design of the flexural and torsional resonator elements may be any of several forms such as that in the referenced Kasai, et al., patent as the specific design of the resonator elements is not pertinent to the present concept. The present concept will operate with many different styles of mechanical filter designs.

It will be noted that the coupling and bridging wires are different widths and that various resonator elements are shown separated from adjacent resonator elements by various amounts. This variable separation is intentional since the coupling is dependent on wire length, position of attachment on the resonator elements and thickness of the wire. These factors are so interrelated that all must be taken into account when designing a mechanical filter for a specific application.

Figure 4:
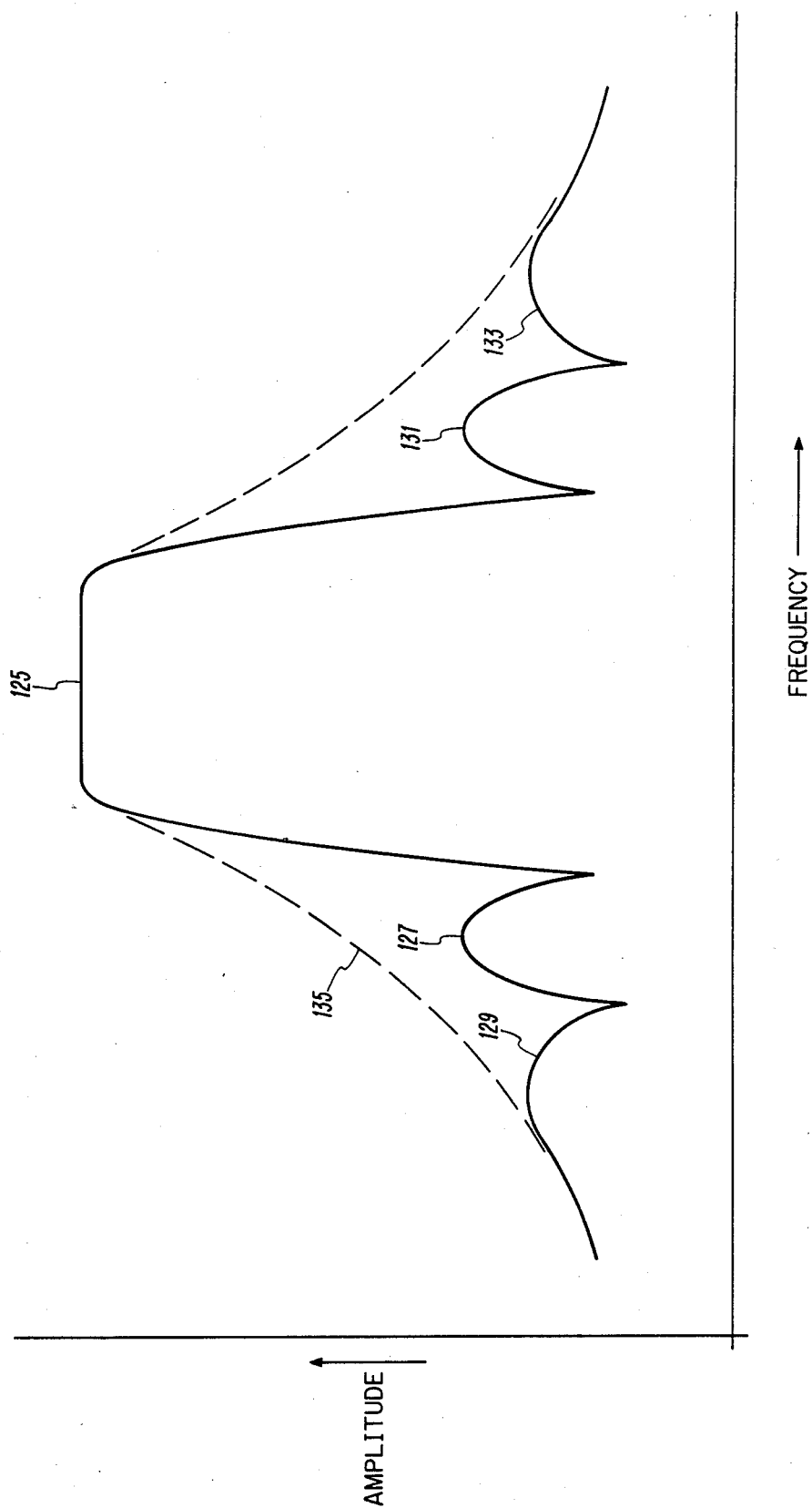

In FIG. 4 a graph is shown of a bandpass filter characteristic with a horizontal scale of frequency and a vertical scale of amplitude of signal appearing at the output of a mechanical filter over the range of frequencies. The solid line 125 has side lobes 127, 129, 131 and 133. A dash line 135 represents the bandpass characteristic of a filter similar to the present design if no bridging wires were used to increase the steepness of the sides of the main or central portion of the bandpass characteristic.

OPERATION

As previously mentioned, extensional and flexural mode resonances are recognized by those skilled in the art as the two resonances which usually cause problems with coupling in bridging wires used between resonator elements. With reference to FIG. 1, it will be noted that when the wires have a zero length or any length which is equal to half integer multiples of the resonant wavelength, the coupling increases to infinity. Between these resonant points of zero length, length $L_1$ and length $L_2$, etc., the coupling decreases to a minimum. In other words, between zero length and $L_1$, a one quarter-wavelength indicates a minimal extensional coupling point. A similar point which would be three quarters of a wavelength as is shown between resonant lengths $L_1$ and $L_2$.

The plus indications which, in FIG. 1 are numbered from 16 to 24 for the first graph and unnumbered in the remaining representations, show the lengths where the flexural resonant modes occur. As long as the coupling wire lengths are short, or in other words, where the order of the flexural resonant modes are low, the effect on the coupling of the modes is significant only when the wire length is within a few thousands of an inch of the resonant length. For higher order modes where the wire is longer, the variation of the flexural resonant modes, with processing variations, are spread over a wider span of length. Thus, greater control in production is needed to prevent spurious responses caused by a flexural resonance within the coupling wire. Because of this, it is advantageous to keep the wires short. Referring to FIG. 1, the ideal length to have a wire would be about half the length between zero and $L_1$ and have it substantially half way between two of the plus marks such as 20 and 22. Here the coupling would be least affected by both flexural and extensional resonances, and have zero slope with variation in wire length.

With conventional designs such as shown in FIGS. 2a and 2c, such a length is not always possible for bridging wires. Typically, the bridging requires crossing over at least two other resonator elements and thus, the minimal distance is likely to be near the first extensional mode resonance of $L_1$. This is especially true of torsional mode resonator filters near 128 kilohertz. In these type of designs, it is essential to hold the bridging wire dimensional parameters and material parameters very tight in order to avoid resonance problems with long wires.

The solution provided by the present inventive concept is to interchange the physical position of the resonator elements. By exchanging the positions of two of the resonators, the coupling wire or bridging wire is required to cross over only one resonator element. FIG. 2a shows a conventional design for bridging in the center of a filter with a coupling wire coupling each of the resonator elements to the adjacent resonator elements and a wire bridging from the second resonator element 34 to the fifth element 40. FIG. 2b shows the same filter designed in accordance with the present concept. By changing the physical position of resonators 34 and 36, no coupling wire needs to be longer than that necessary to cross over a single intermediate resonator element. Where the conventional design of FIG. 2a has five short coupling wires and one long bridging wire, the new design has three short wires and three intermediate length wires. By selection of the diameter of the wires and selection of connection points to the resonator elements, the length of the intermediate length wires and the short coupling wires can both be chosen near one quarter-wavelength of the extensional resonant mode.

FIG. 2c is representative of a prior art design of an input section of a bridge filter with element 60 being an input transducer resonator. The set of coupling wires 72 connect each of the adjacent resonator elements in acoustical series relationship. The bridging wire 74 passes over two resonator elements in connecting input transducer 60 to resonator element 66.

The same concept as outlined above, was used to interchange the physical position of resonator elements 60 and 62 so that the input signal is still applied to resonator element or transducer element 60 and then acoustically coupled to the second element via coupling element 80 and then to the next element via coupling element 82. As will be noted, the bridging wire 86 now can be shortened such that it is substantially less than the distance of the first extensional resonant wavelength.

FIG. 3 is a representation of an actual device. Resonator elements 90 and 114 are transducers which operate in a flexural mode with modified langevin type piezoelectric transducers centrally located as detailed in the Figure. The remaining resonator elements 92 through 110 operate in the torsional mode. The layout of this filter is similar to that shown in FIG. 2d. In other words, the input resonator is placed between the second and third resonator elements while the output resonator 114 is placed between elements 108 and 110. In this configuration, the bridging from resonators 1 to 4 and 6 to 9 need cross over one other resonator element. While coupling wires 98 and 112 are longer than would be necessary in the prior art arrangement, they are still not long enough to cause the problems of the type induced in the conventional design of FIG. 2c where the bridging wire 74 must cross over two elements and thus may be a length which is very close to the extensional resonant mode. In such an instance, the distance between the resonator elements is typically increased further so as to make the length of bridging wire 74 longer than the $L_1$ length shown in FIG. 1. Such an approach of necessity increases the total physical size of the mechanical filter and increases the probability of problems from flexural spurious mode situations.

SUMMARY

While I have only shown two applications of my concept to mechanical filter configurations as illustrated in FIGS. 2b and 2d, it is to be emphasized that the inventive concept lies in the interchanging of resonator elements to decrease the length (distance between attachment paints) of bridging wires even though it may increase the number of medium length wires used for the series acoustical coupling from input to output of the mechanical filter. The rational for the above being that it is easier to build operating mechanical filters within manufacturing tolerances using a plurality of medium length wires and short coupling wires than it is to build a mechanical filter having a majority of short coupling wires and a few long bridging wires.

It is my intent, therefore, to be limited in scope not by the specific implementations presented as examples, but only by the scope of the appended claims wherein I claim:

1. The method of reducing flexural spurious mode problems in acoustic bridging wires used in modifying the response characteristics of a section of a resonator type mechanical filter including input and output resonators comprising the steps of:
arranging the physical position of at least one input and output resonators of a resonator type mechanical filter including a plurality of acoustically intermediate resonators whereby distances between resonators to be acoustically bridged are reduced as compared to the physical equivalent series acoustical coupling distance between the resonators to be bridged;
acoustically coupling the resonators including those that are not physically adjacent using coupling wires; and
acoustically coupling the input and output resonators of the filter to predetermined other resonators using bridging wires whereby the physical layout of the resonators given designators 1 to n from one end point to an opposing end point of the filter will not correspond to the passage of electrical signals from input to output through the resonators of the filter.

2. Mechanical filter apparatus including n resonator elements with resonator #1 being an input transducer resonator and resonator #n being an output transducer resonator and requiring acoustical series consecutive connections from #1 to #n comprising, in combination:
an assembly of n resonator element means having a designated numerical acoustical sequence including #1 input resonator means and #n output transducer resonator means;
acoustic bridging means connecting said input transducer resonator means to an associated nonadjacent resonator means for enhancing the steepness of the bandpass characteristic where the physical bridging length is less than the acoustical series coupling length starting from a lower number resonator and continuing toward a higher number resonator;
acoustic bridging means electrically connecting said output transducer resonator means to a further associated modifying resonator means where the physical bridging length is less than the series coupling length; and
coupling means for connecting the resonator elements in numerical sequence, where the resonator physical position sequence from one end of the assembly to the other end of the assembly is different from the resonator numerical connection sequence from signal input to signal output.

3. A section of a mechanical filter apparatus comprising, in combination:
a plurality of at least four resonator elements means n, n+1 and n+2 through m where element means n is physically intermediate n+1 and n+2 and element m is not intermediate n+1 and n+2;
coupling means acoustically coupling said resonator element means in series from n to n+1 to n+2 through m to form the equivalent of a filter ladder network section; and
bridging means acoustically coupling element means n to element means m.

4. The method of reducing extensional coupling variation problems in acoustic bridging wires used in modifying the response characteristics of a section of a resonator type mechanical filter including input and output resonators among a plurality of resonators comprising the section comprising the steps of:
arranging the physical position of input and output resonators of the section whereby they are physically intermediate resonators to be acoustically series coupled whereby physical distances between resonators to be acoustically bridged are reduced as compared to the apparent series acoustical coupling length;
acoustically coupling the resonators from input to output, including those that are not physically adjacent, using coupling wires; and
acoustically coupling the input and output resonators of the section with bridging wires.

5. Apparatus for reducing extensional coupling variation problems occurring when acoustic bridging wires are used to modify the response characteristics of a section of a resonator type mechanical filter comprising, in combination:
support means for a mechanical filter apparatus;
a plurality of resonators, including input and output resonator means, attached to said support means with at least one of said input and output resonator means being physically positioned whereby it is not an end resonator;
means for supplying input electrical signals to said input resonator means;
coupling wire means acoustically coupling all of said plurality of resonators in an acoustic series coupling connection between said input and output resonator means whereby the wire means used to form an acoustical path between said input and output means physically changes direction of acoustic signal travel at least once; and bridging wire means connecting said input and output resonator means to others of said plurality of resonators for adjusting the steepness of the sideband characteristics of the mechanical filter, the length of said bridging wire means being less than if said input and output resonator means were physically at the extreme ends of said plurality of resonators.

6. The method of reducing the length of bridging wires used to control the steepness of the bandpass characteristic of a mechanical filter comprising the steps of:

arranging a plurality of resonator elements including input and output resonator means in a row wherein the physical location of each of said input and output resonator means in the row is prior to each end of the plurality of resonator elements;

acoustically coupling said resonator elements and said input and output resonator means including those that are not physically adjacent using coupling wires in an acoustical series arrangement from said input resonator means to said output resonator means; and acoustically coupling the input and output resonator means of said filter with bridging wires to other resonator elements for increasing the steepness of the bandwidth characteristic of the mechanical filter.

* * * * *